(12) United States Patent
Cranford, Jr. et al.

(10) Patent No.: US 8,416,009 B2
(45) Date of Patent: Apr. 9, 2013

(54) SOLUTIONS FOR CONTROLLING BULK BIAS VOLTAGE IN AN EXTREMELY THIN SILICON-ON-INSULATOR (ETSOI) INTEGRATED CIRCUIT CHIP

(75) Inventors: Hayden C. Cranford, Jr., Cary, NC (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/181,754

(22) Filed: Jul. 13, 2011

(65) Prior Publication Data

US 2013/0015911 A1  Jan. 17, 2013

(51) Int. Cl.
*H01L 27/12* (2006.01)
(52) U.S. Cl.
USPC .......... 327/534; 327/535; 327/537; 327/545; 327/546; 257/347; 257/E27.112; 326/82; 326/83
(58) Field of Classification Search ........... 327/534, 327/535, 537, 545, 546; 257/437, E27.112; 326/82, 83
See application file for complete search history.

(56) References Cited

U.S. PATENT DOCUMENTS

| | | | |
|---|---|---|---|
| 7,112,997 B1 * | 9/2006 | Liang et al. | 326/81 |
| 7,129,745 B2 | 10/2006 | Lewis et al. | |
| 7,342,287 B2 | 3/2008 | Chuang et al. | |
| 7,495,471 B2 | 2/2009 | Perisetty | |
| 7,573,317 B2 | 8/2009 | Lewis et al. | |
| 7,592,832 B2 | 9/2009 | Perisetty | |
| 7,598,731 B1 | 10/2009 | Masleid et al. | |
| 7,629,233 B2 | 12/2009 | Bernstein et al. | |
| 7,675,317 B2 | 3/2010 | Perisetty | |
| 7,683,442 B1 | 3/2010 | Burr et al. | |
| 7,687,365 B2 | 3/2010 | Sleight | |
| 7,816,742 B1 | 10/2010 | Koniaris et al. | |
| 2010/0259965 A1 * | 10/2010 | Kurjanowicz et al. | 365/94 |

OTHER PUBLICATIONS

Kang et al., "On-Chip Variability Sensor Using Phase-Locked Loop for Detecting and Correcting Parametric Timing Failures", IEEE Transactions on Very Large Scale Integration (VLSI) Systems, vol. 18, No. 2, Feb. 2010.
Noel et al., "A Simple and Efficient Concept for Setting up Multi-V Devices in Thin Box Fully Depleted SOI Technology", IEEE, 2009.
Ohtou et al., "Variable-Body-Factor SOI MOSFET With Ultrathin Buried Oxide for Adaptive Threshold Voltage and Leakage Control", IEEE Transactions on Electron Devices, vol. 55, No. 1, Jan. 2008.

(Continued)

*Primary Examiner* — Ngan Ngo
(74) *Attorney, Agent, or Firm* — David A. Cain; Hoffman Warnick LLC

(57) ABSTRACT

Solutions for optimizing a bulk bias across a substrate of an ETSOI device are disclosed. In one embodiment, an apparatus for optimizing a bulk bias across a substrate of an ETSOI device is disclosed, including: a sensing circuit for sensing at least one predetermined circuit parameter; a charging circuit for applying a bias voltage to the substrate of the ETSOI device; and a processing circuit connected to the sensing circuit and the charging circuit, the processing circuit configured to receive an output of the sensing circuit, and adjust the bias voltage applied to substrate of the ETSOI device in response to determining whether the bias voltage deviates from a target amount.

6 Claims, 4 Drawing Sheets

OTHER PUBLICATIONS

Neau et al., "Optimal Body Bias Selection for Leakage Improvement and Process Compensation Over Different Technology Generations", ISLPED 2003, Seoul, Korea.

Kuge et al., "SOI-DRAM Circuit Technologies for Low Power High Speed Multigiga Scale Memories", IEEE Journal of Solid State Circuits, vol. 31, No. 4, Apr. 1996.

* cited by examiner

SOLUTIONS FOR CONTROLLING BULK BIAS VOLTAGE IN AN EXTREMELY THIN SILICON-ON-INSULATOR (ETSOI) INTEGRATED CIRCUIT CHIP

BACKGROUND

The subject matter disclosed herein relates to solutions for controlling the bulk bias voltage in an integrated circuit chip. More specifically, the subject matter disclosed herein relates to solutions for controlling the bulk bias voltage in an integrated circuit chip fabricated in an extremely thin silicon-on-insulator (ETSOI) process.

Conventionally, attempts have been made to improve the performance of complementary-metal oxide semiconductor (CMOS) devices (e.g. transistors), and/or decrease the off-state current leakage of these devices. Some prior approaches have included the use of adaptive body biasing to modify the bias voltage across portions of these devices. More particularly, these approaches have used a location-specific circuit to control the voltage applied to individual transistors, or particular groups of transistors using adaptive body biasing. However, these conventional approaches still require design and implementation of specific circuitry and isolating structures, which may be both costly and space-consuming.

BRIEF SUMMARY

Solutions for optimizing a bulk bias across a substrate of an ETSOI device are disclosed. In one embodiment, an apparatus for optimizing a bulk bias across a substrate of an ETSOI device is disclosed, including: a sensing circuit for sensing at least one predetermined circuit parameter; a charging circuit for applying a bias voltage to the substrate of the ETSOI device; and a processing circuit connected to the sensing circuit and the charging circuit, the processing circuit configured to receive an output of the sensing circuit, and adjust the bias voltage applied to substrate of the ETSOI device in response to determining whether the bias voltage deviates from a target value.

A first aspect includes an apparatus for optimizing a bulk bias across a substrate of an ETSOI device, the apparatus including: a sensing circuit for sensing at least one predetermined circuit parameter; a charging circuit for applying a bias voltage to the substrate of the ETSOI device; and a processing circuit connected to the sensing circuit and the charging circuit, the processing circuit configured to receive an output of the sensing circuit, and adjust the bias voltage applied to substrate of the ETSOI device in response to determining whether the bias voltage deviates from a target value.

A second aspect includes a method for providing a bulk bias across an extremely thin silicon-on-insulator (ETSOI) device, the method including: monitoring a value of a designated circuit parameter in the ETSOI device; and adjusting a bias voltage applied to substantially an entirety of a substrate of the ETSOI device to modify the value of the designated circuit parameter in response to determining whether the value of the designated circuit parameter deviates from a target value.

A third aspect includes an extremely thin silicon-on-insulator (ETSOI) integrated circuit structure including: a bulk silicon substrate; an n-type field effect transistor (NFET) overlying a first portion of the bulk silicon substrate; a p-type field effect transistor (PFET) overlying a second portion of the bulk silicon substrate; and a shallow trench isolation (STI) separating the NFET and the PFET on a surface of the bulk silicon substrate, wherein the STI does not extend through the surface of the bulk silicon substrate.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
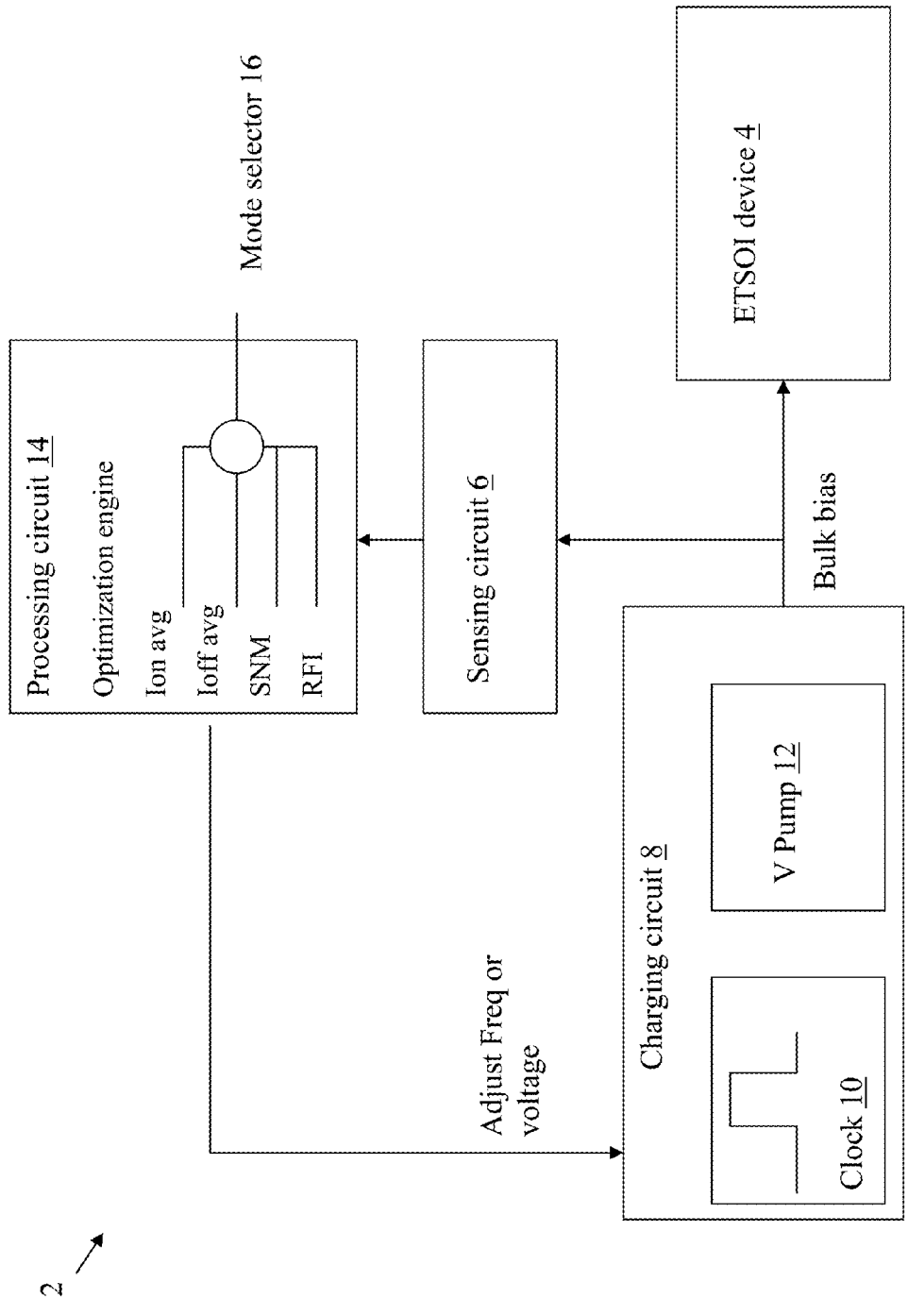
FIG. 1 shows a schematic depiction of an apparatus for optimizing a bulk bias across an ETSOI device according to embodiments.

As noted herein, the subject matter disclosed relates to solutions for controlling the bulk bias voltage in an integrated circuit chip. More specifically, the subject matter disclosed herein relates to solutions for controlling the bulk bias voltage in an integrated circuit chip fabricated in an extremely thin silicon-on-insulator (ETSOI) process.

Conventionally, attempts have been made to improve the performance of complementary-metal oxide semiconductor (CMOS) devices (e.g. transistors), and/or decrease the off-state current leakage of these devices. Some prior approaches have included the use of adaptive body biasing to modify the bias voltage across portions of these devices. More particularly, these approaches have used a location-specific circuit to control the voltage applied to individual transistors, or particular groups of transistors using adaptive body biasing. However, these conventional approaches still require design and implementation of specific circuitry and isolating structures, which may be both costly and space-consuming.

In contrast to these conventional approaches, aspects disclosed include adjusting the bias voltage on the substrate, or bulk layer beneath a buried oxide (BOX) layer of an extremely thin silicon-on-insulator (ETSOI) integrated circuit device. As is known in the art, the term ETSOI can refer to a silicon containing layer having a thickness less than approximately 10 nanometers (nm). Because of the thinness of the BOX layer in the ETSOI device and the absence of isolating structures, the target voltages of all transistors (e.g., metal-oxide-semiconductor, or MOS transistors) on the chip can be modulated simultaneously.

In one embodiment, an apparatus for optimizing a bulk bias across an ETSOI device in order to meet one or more circuit parameters is disclosed. These circuit parameters may be optimized according to the mutual performance of both an NFET and a PFET structure in the ETSOI device, and the target bias value can be dictated by a combination of the impact on the PFET and the impact on the NFET structures, respectively. As such, the term "optimize" when referring to bias voltage herein may refer to the process of determining a bulk bias voltage that generates a desired performance result in both the NFET and the PFET structures in the ETSOI device.

According to embodiments herein, the apparatus for optimizing a bulk bias across the ETSOI device can include: a) a sensing circuit for sensing one or more designated circuit parameters (e.g., off-state leakage, switching speed, memory cell retention, etc.); b) a charging circuit for applying a bias voltage to the substrate of the ETSOI device; and c) a processing circuit connected to the sensing circuit and the charging circuit, the processing circuit configured to receive an output of the sensing circuit, and adjust the bias voltage applied to the substrate of the ETSOI device in response to determining whether the bias voltage deviates from a target value, as dictated by the designated circuit parameter(s). The apparatus may be configured to iteratively repeat the sensing and charging in order to optimize the designed parameter.

In another embodiment, a method for optimizing a bulk bias across an ETSOI device is disclosed. The method can include: a) monitoring a value of a designated circuit parameter in an extremely thin silicon-on-insulator (ETSOI) device; and b) adjusting a voltage bias applied to a substrate of the ETSOI device to modify the value of the designated circuit parameter in response to determining whether the value of the designated circuit parameter deviates from a target value.

In yet another embodiment, an extremely thin silicon-on-insulator (ETSOI) integrated circuit structure is disclosed. The ETSOI integrated circuit structure can include: a) a bulk silicon substrate; b) an n-type field effect transistor (NFET) overlying a first portion of the bulk silicon substrate; c) a p-type field effect transistor (PFET) overlying a second portion of the bulk silicon substrate; and d) a shallow trench isolation (STI) separating the NFET and the PFET on a surface of the bulk silicon substrate. The STI does not extend through the surface of the bulk silicon substrate, and as such, the bulk silicon substrate remains substantially unprocessed.

Turning to the figures, FIG. 1 shows a schematic depiction of an apparatus 2 for optimizing a bulk bias across an ETSOI device 4 according to embodiments. The apparatus 2 can include a sensing circuit 6 for sensing one or more designated circuit parameters from the ETSOI device 4. Circuit parameters may include one or more of: current leakage, e.g., off-state current leakage; switching speed; and memory cell retention. It is understood that other circuit parameters known in the art may be monitored via the sensing circuit 6. Also shown included in the apparatus 2 for optimizing a bulk bias across the ETSOI device 4 is a charging circuit 8 for applying a bias voltage (e.g., a bulk bias voltage) to the substrate of the ETSOI device 4. The charging circuit can include a clock 10 and a voltage (V) pump 12 for providing an adjustment to the frequency or voltage applied to the substrate of the ETSOI device 4.

Additionally, the apparatus 2 can include a processing circuit 14 connected to the sensing circuit 6 and the charging circuit 8. The processing circuit 14 can be configured to receive an output of the sensing circuit 6 (e.g., a sensed bias voltage) and adjust the bias voltage applied to the substrate of the ETSOI device 4 via the charging circuit 8. The processing circuit 14 can adjust (or, optimize) the bias voltage applied to the substrate of the ETSOI device 4 in response to determining whether the bias voltage sensed by the sensing circuit 6 deviates from one or more target values. The processing circuit 14 can compare the sensed bias voltage with a target value, which can be dictated by designated circuit parameters optimized for a particular performance feature. It is understood that the processing circuit can be intended to iteratively optimize the bias voltage applied across the substrate of the ETSOI device 4 for the purposes of improving performance aspects of transistors (e.g., NFETs and PFETs) in the ETSOI device 4. As is described further herein, modifying the bias voltage across the substrate of the ETSOI device 4 can have distinct effects on the NFETs and PFETS within the ETSOI device 4, and in some circumstances, may have substantially opposite effects on these FETs. For example, modifying the bias voltage across the substrate of the ETSOI device 4 can have a positive effect on the NFET (e.g., decreasing leakage current) while having a negative effect on the PFET (e.g., increasing leakage current).

As noted herein, a non-exhaustive list of dedicated circuit parameters can include: off-state leakage current, switching speed and/or memory cell retention. The processing circuit 14 can include a mode selector 16, allowing for selection of distinct modes such as average on-current (Ion), average off-current (Ioff), static noise margin (SNM) and/or radio frequency interference (RFI). The apparatus 2 may be configured to iteratively repeat the sensing and charging in order to optimize the designated circuit parameter. That is, the apparatus 2 can be configured as a continuous feedback loop to continuously modify a bulk bias applied to the substrate of the ETSOI device 4. The apparatus 2, in some cases, can be configured to iteratively repeat the sensing, processing and biasing actions according to a predetermined cycle (e.g., X times per nanosecond, per second, etc.).

Figure 2:
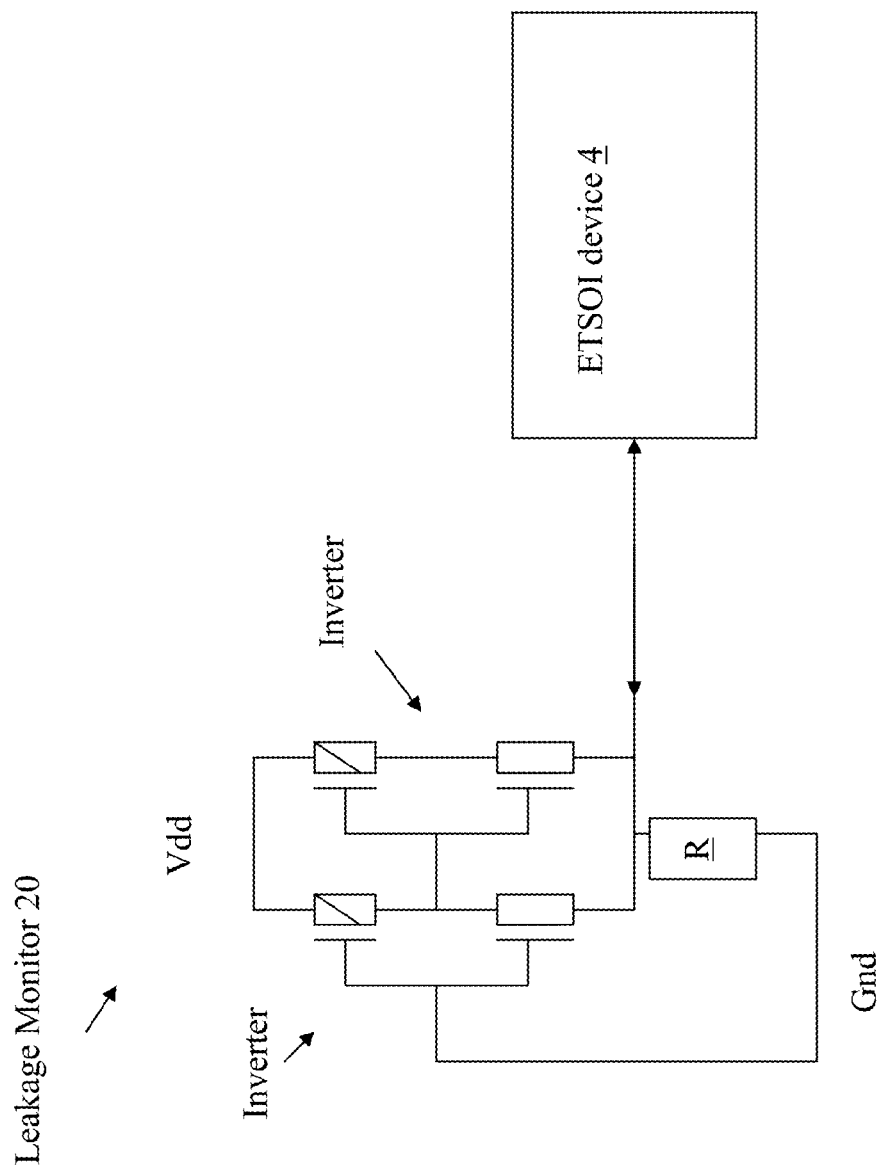
FIG. 2 shows a schematic depiction of an example leakage monitor according to embodiments.

Turning to FIG. 2, a schematic depiction of an example leakage (e.g., current leakage) monitor 20 is shown according to embodiments of the invention, where the leakage monitor may be contained within a portion of the sensing circuit 6 and/or the processing circuit 14 of FIG. 1. Additionally, it is understood that all of the circuits shown and described herein (e.g., sensing circuit 6, charging circuit 8, processing circuit 14, etc.) may be integrated and formed within the same physical structure. Additionally, these circuits may share common components, where applicable. In any case, returning to FIG. 2, an example of a current leakage monitor 20 is shown according to embodiments, where the current leakage monitor 20 is configured to monitor a current leakage within the ETSOI device 4. As shown, the leakage monitor may include two inverter stage structures (or inverters) coupled with a resistor (R), power/voltage supply (Vdd) and ground (gnd).

Figure 3:
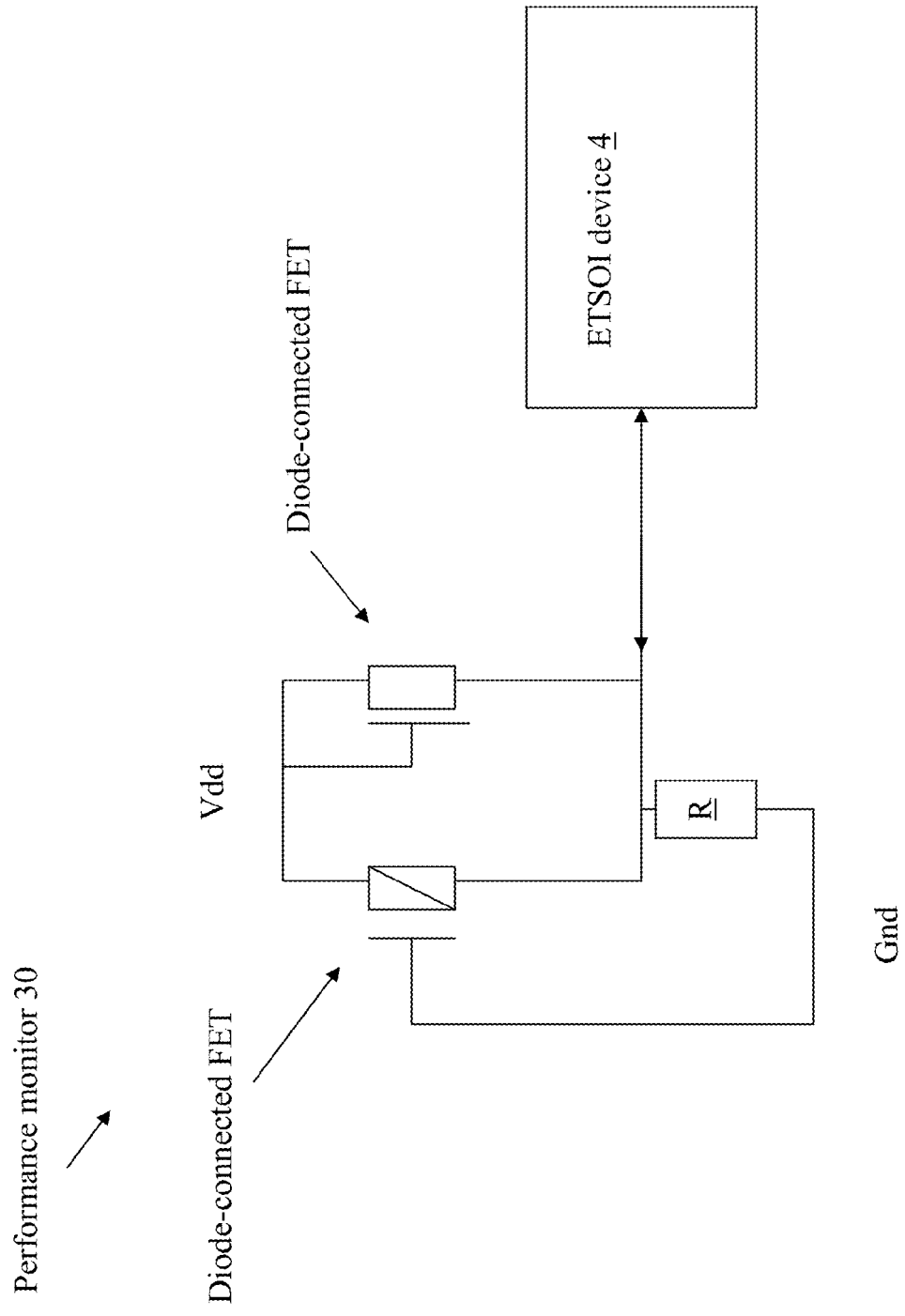
FIG. 3 shows a schematic depiction of an example performance monitor according to embodiments.

FIG. 3 shows an example of a performance monitor 30 according to embodiments of the invention, where the performance monitor 30 may be contained within a portion of the sensing circuit 6 and/or the processing circuit 14 of FIG. 1. The performance monitor 30 can include a parallel diode-connected FET structure, coupled with a resistor (R), a power/voltage supply (Vdd) and ground (gnd). In one example, the performance monitor can monitor a parameter such as the sum of on-current ($I_{on}$) readings from the ETSOI device It is understood that in the aspects of the invention described herein, as the common, or bulk bias is modified, that PFET structures and NFET structures will react in substantially opposite manners to the bias modification. That is, as the NFET becomes less prone to current leakage, the PFET becomes more prone to current leakage; and as the NFET becomes more powerful, the PFET becomes less so, and vice versa. Therefore, an optimum bias for a given parameter may be determined by balancing the corresponding reaction of the NFETs and PFETS to modifications of the bulk bias.

Figure 4:
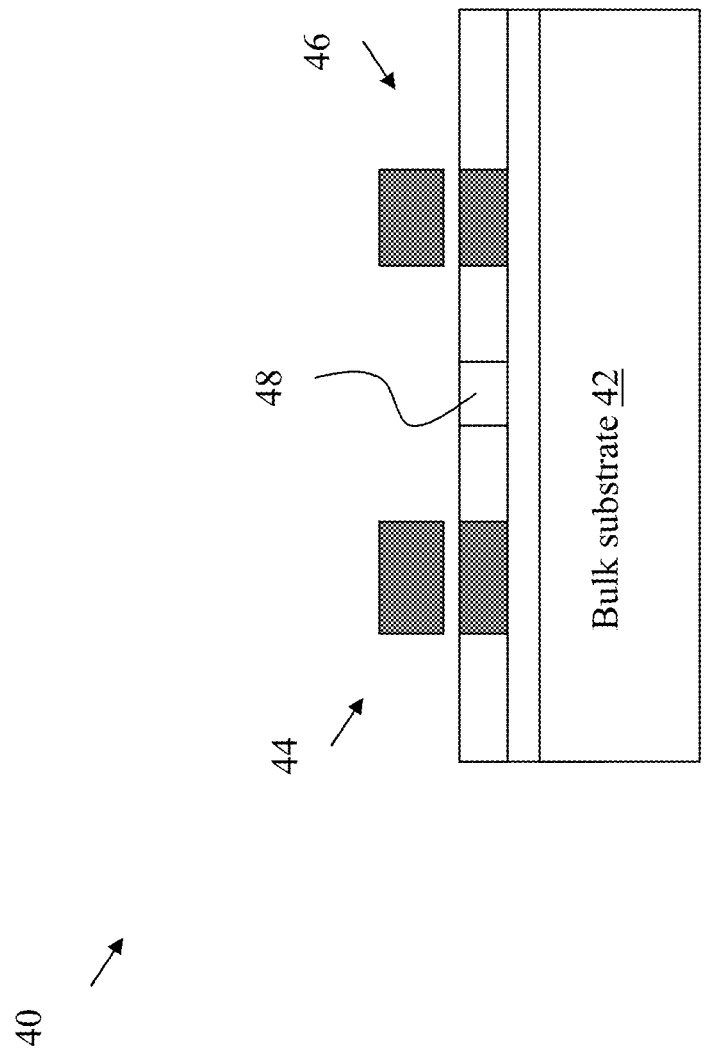
FIG. 4 shows a schematic side cross-sectional view of an extremely thin silicon-on-insulator (ETSOI) device according to embodiments.

FIG. 4 shows one example of an ETSOI device 40 according to embodiments of the invention. It is understood that the ETSOI device 40 shown in FIG. 4 may be substantially similar to the ETSOI device 4 shown and described herein, however, this is not necessarily the case. That is, the apparatus 2

(FIG. 1) and other circuits shown and described herein may be compatible with the ETSOI device 40, but may also be compatible with a plurality of distinct ETSOI devices not specifically shown herein. In any case, the ETSOI device 40 of FIG. 4 can include a bulk substrate 42 (e.g., a bulk silicon substrate); an n-type field effect transistor (NFET) 44 overlying a first portion of the bulk silicon substrate 42; a p-type field effect transistor (PFET) 46 overlying a second portion of the bulk silicon substrate 42; and a shallow trench isolation (STI) 48 separating the NFET 44 and the PFET 46 on a surface of the bulk silicon substrate 42, wherein the STI 48 does not extend through (or, into) the surface of the bulk silicon substrate 42. In contrast to conventional (e.g., more complex) ETSOI devices, the ETSOI device 40 shown and described with reference to FIG. 4 can utilize a shallower STI (e.g., STI 48) that does not extend below the surface of the bulk silicon substrate 42. That is, the STI 48 can separate the NFET 44 and PFET 46 at a surface of the bulk silicon substrate 42, where the entire bulk silicon substrate 42 can be biased according to embodiments of the invention described herein.

It is understood that aspects of the invention allow for the application of a bias across substantially all of the bulk substrate 42 in order to meet (or, optimize) at least one of the predetermined circuit parameters described herein (e.g., leakage and/or performance). These circuit parameters may be optimized according to the mutual performance of both the NFET and PFET structures in the ETSOI device, and the target value can be dictated by a combination of the impact on the PFET and the impact on the NFET structures, respectively. As such, the term "optimize" when referring to bias voltage herein may refer to the process of determining a bulk bias voltage that generates a desired performance result in both the NFET and the PFET structures in the ETSOI device. It is further understood that the ETSOI device 40 shown and described herein can be coupled to the apparatus 2 shown and described with reference to FIGS. 1-3, which can allow for biasing of the bulk substrate 42 according to the actions described herein.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus for providing a bulk bias across substantially an entire substrate of an extremely thin silicon-on-insulator (ETSOI) device, the apparatus comprising:
   a sensing circuit for sensing at least one predetermined circuit parameter;
   a charging circuit for applying a bias voltage to substantially the entire substrate of the ETSOI device; and
   a processing circuit connected to the sensing circuit and the charging circuit, the processing circuit configured to receive an output of the sensing circuit, and adjust the bias voltage applied to the entire substrate of the ETSOI device by the charging circuit in response to determining whether the bias voltage deviates from a target value.

2. The apparatus of claim 1, wherein the target value of the bias voltage is based upon the at least one designated circuit parameter.

3. The apparatus of claim 1, wherein the apparatus is configured to iteratively repeat the sensing on a predetermined cycle.

4. The apparatus of claim 3, wherein the charging circuit is configured to iteratively repeat the applying of the bias voltage in response to the processing circuit determining whether the bias voltage deviates from the target value.

5. The apparatus of claim 1, wherein the at least one circuit parameter includes off-state leakage, switching speed or memory cell retention.

6. The apparatus of claim 1, wherein the sensing circuit includes at least one of a leakage monitor or a performance monitor.

* * * * *